(12) United States Patent
Tsurunari et al.

(10) Patent No.: US 7,733,196 B2
(45) Date of Patent: Jun. 8, 2010

(54) ANTENNA SHARING DEVICE

(75) Inventors: Tetsuya Tsurunari, Osaka (JP);
Katsuya Fujii, Hyogo (JP)

(73) Assignee: Panasonic Corporation, Osaka (JP)

( * ) Notice: Subject to any disclaimer, the term of this patent is extended or adjusted under 35 U.S.C. 154(b) by 175 days.

(21) Appl. No.: 11/911,845

(22) PCT Filed: Apr. 20, 2006

(86) PCT No.: PCT/JP2006/308283

§ 371 (c)(1),
(2), (4) Date: Oct. 18, 2007

(87) PCT Pub. No.: WO2006/118039

PCT Pub. Date: Nov. 9, 2006

(65) Prior Publication Data

US 2009/0058557 A1    Mar. 5, 2009

(30) Foreign Application Priority Data

Apr. 27, 2005    (JP) .............................. 2005-129278

(51) Int. Cl.
*H03H 9/72* (2006.01)
(52) U.S. Cl. ...................................... 333/133; 333/194
(58) Field of Classification Search .................. 333/133
See application file for complete search history.

(56) References Cited

U.S. PATENT DOCUMENTS

| | | | | |
|---|---|---|---|---|
| 4,543,547 A | * | 9/1985 | Picquendar et al. | 333/193 |
| 5,864,260 A | * | 1/1999 | Lee | 333/133 |
| 6,297,712 B1 | * | 10/2001 | Kadota et al. | 333/133 |
| 6,380,823 B1 | * | 4/2002 | Ikata et al. | 333/133 |
| 6,737,936 B2 | * | 5/2004 | Noguchi | 333/133 |
| 7,030,716 B2 | * | 4/2006 | Tsutsumi et al. | 333/133 |
| 7,196,594 B2 | * | 3/2007 | Cheema et al. | 333/133 |
| 7,292,122 B2 | * | 11/2007 | Kanasaki et al. | 333/193 |

(Continued)

FOREIGN PATENT DOCUMENTS

JP    62-061413    *   3/1987   .................. 333/193

(Continued)

OTHER PUBLICATIONS

International Search Report issued Jul. 11, 2006 in the International (PCT) Application of which the present application is the U.S. National Stage.

(Continued)

*Primary Examiner*—Barbara Summons
(74) *Attorney, Agent, or Firm*—Wenderoth, Lind & Ponack, L.L.P.

(57) ABSTRACT

An antenna duplexer includes a piezoelectric substrate having a surface, a grounding terminal to be grounded, first and second surface acoustic wave (SAW) filters mounted on the piezoelectric substrate, first and second terminals connected to the first and second SAW filters, respectively, and a line mounted on the surface of the piezoelectric substrate between the first SAW filter and the second SAW filter. A stray coupling path is produced between the first and second terminals. A first end of the line is connected to the grounding terminal. A second end of the line opens and is coupled capacitively to the stray coupling path. The antenna duplexer has a large isolation characteristic between the surface acoustic wave filters.

2 Claims, 3 Drawing Sheets

U.S. PATENT DOCUMENTS

| | | | |
|---|---|---|---|
| 7,400,216 B2 * | 7/2008 | Fuse | 333/133 |
| 7,477,117 B2 * | 1/2009 | Pitschi et al. | 333/193 |
| 2003/0062969 A1 | 4/2003 | Inoue | |
| 2004/0090288 A1 | 5/2004 | Inoue | |

FOREIGN PATENT DOCUMENTS

| | | | |
|---|---|---|---|
| JP | 4-288719 | 10/1992 | |
| JP | 05-299969 | * 11/1993 | 333/193 |
| JP | 07-231240 | 8/1995 | |
| JP | 2002-330057 | 11/2002 | |
| JP | 2003-101381 | 4/2003 | |
| WO | WO 2005/011114 | * 2/2005 | |

OTHER PUBLICATIONS

Supplementary European Search Report dated Nov. 23, 2009 in counterpart European Application No. 06732141.

* cited by examiner

US 7,733,196 B2

ANTENNA SHARING DEVICE

TECHNICAL FIELD

The present invention relates to an antenna duplexer used in a communication apparatus.

BACKGROUND ART

A conventional antenna duplexer is disclosed in Japanese Patent Laid-Open Publication No. 2002-330057 includes surface acoustic wave filters different from each other. Each of the filters includes comb-shaped electrodes provided on a single piezoelectric substrate.

Such a conventional antenna duplexer requires isolation between the surface acoustic wave filters for allowing the surface acoustic wave filters to exert their characteristics effectively. To meet this requirement, the arrangement of these filters on the piezoelectric substrate is optimized, and a groove is provided in the substrate between a transmitting filter and a receiving filter so as to increase the isolation between the filters.

In the conventional antenna duplexer, the filters may be coupled with each other due to a surface acoustic wave coupling for coupling the filters by surface acoustic waves on the piezoelectric substrate and to a high-frequency coupling form coupling the filters by a transmitting signal and a received signal interfere with each other. The groove provided in the substrate cannot suppress the high-frequency coupling, hence not improving the isolation between the surface acoustic wave filters.

SUMMARY OF THE INVENTION

An antenna duplexer includes a piezoelectric substrate having a surface, a grounding terminal to be grounded, first and second surface acoustic wave (SAW) filters mounted on the piezoelectric substrate, first and second terminals connected to the first and second SAW filters, respectively, and a line mounted on the surface of the piezoelectric substrate between the first SAW filter and the second SAW filter. A stray coupling path is produced between the first and second terminals. A first end of the line is connected to the grounding terminal. A second end of the line opens and is coupled capacitively to the stray coupling path.

The antenna duplexer has large isolation characteristic between the surface acoustic wave filters.

REFERENCE NUMERALS

1 Package
2 Piezoelectric Substrate
2A Surface of Piezoelectric Substrate
4 Receiving SAW Filter (Second SAW Filter)
5 Transmitting SAW Filter (First SAW Filter)
7 Transmitting Terminal (First Terminal)
8 Receiving Terminal (Second Terminal)
9 Antenna Terminal
12 Shielding Line
12A End of Shielding Line (First End)
12B End of Shielding Line (Second End)
13 Stray Coupling Path
14 Coupling Capacitor

DETAIL DESCRIPTION OF THE PREFERRED EMBODIMENT

Figure 1:
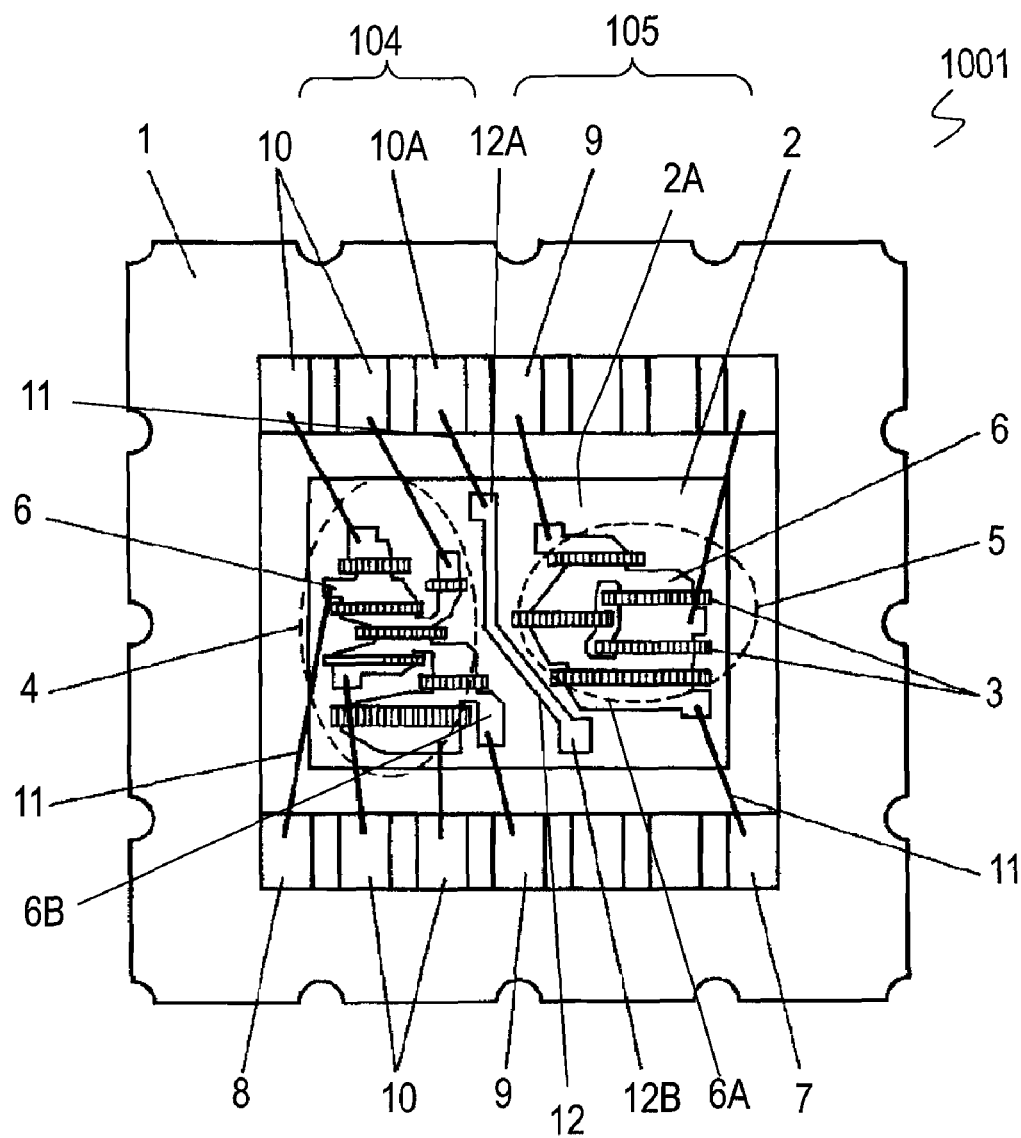
FIG. 1 is a top view of an antenna duplexer according to an exemplary embodiment of the present invention.

FIG. 1 is a top view of an antenna duplexer 1001 for use in a high-frequency module of a communications apparatus, such as a mobile telephone, to separate a transmitting signal and a received signal from each other, according to an exemplary embodiment of the present invention. The antenna duplexer 1001 includes a package 1 made of ceramic board and a piezoelectric substrate 2 accommodated in the package 1. The piezoelectric substrate 2 provides surface acoustic wave (SAW) filters. A receiving SAW filter 4 and a transmitting SAW filter 5 including transducers 3 including comb-shaped electrodes are mounted on a surface 2A of the piezoelectric substrate 2. The transducers 3 are connected with a wiring pattern 6.

A transmitting terminal 7, a receiving terminal 8, an antenna terminal 9, and grounding terminals 10 and 10A are provided at the package 1. The transmitting terminal 7 and the receiving terminal 8 are connected to the transmitting SAW filter 5 and the receiving SAW filter 4, respectively. These terminals are connected with the transmitting SAW filter 5 and the receiving SAW filter 4 via bonding wires 11.

The surface 2A of the piezoelectric substrate 2 has a region 105 thereof having the transmitting SAW filter 5 mounted thereon and a region 104 having the receiving SAW filter 4 mounted thereon. The transmitting SAW filter 5 and the receiving SAW filter 4 are coupled to each other by a high-frequency coupling which causes a transmitting signal and a received signal to interfere with each other. A shielding line 12 is provided on the surface 2A of the piezoelectric substrate between the regions 104 and 105 for suppressing the high-frequency coupling between the SAW filters 4 and 5.

The shielding line 12 has ends 12A and 12B. The end 12A is connected via the bonding wire 11 to the grounding terminal 10A. The grounding terminal 10A is to be grounded. The end 12B opens as an open end. Being grounded, the shielding line 12 electro-magnetically isolates the SAW filters 4 and 5.

Figure 2:
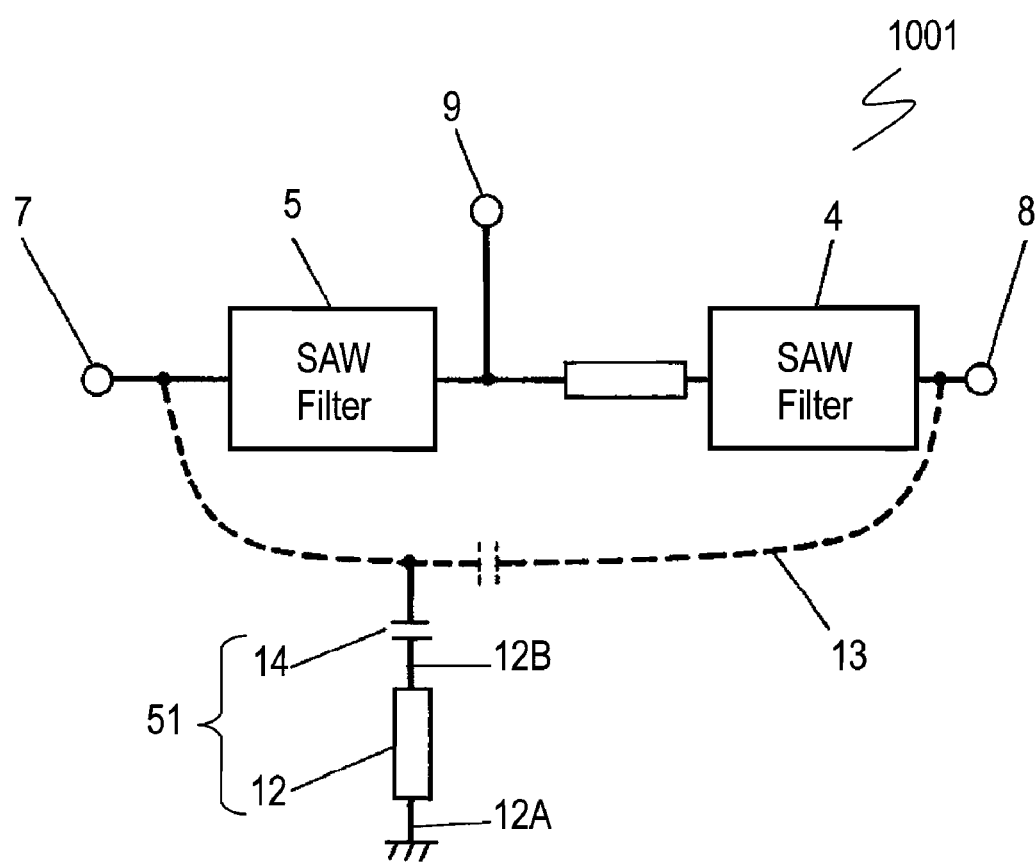
FIG. 2 is an equivalent circuit diagram of the antenna duplexer according to the embodiment.

FIG. 2 is an equivalent circuit diagram of the antenna duplexer 1001. The transmitting SAW filter 5 is connected between the antenna terminal 9 and the transmitting terminal 7. The receiving SAW filter 4 is connected between the antenna terminal 9 and the receiving terminal 8. A stray coupling path 13 may be produced due to parasitic capacitance coupling between the transmitting terminal 7 and the receiving terminal 8. The end 12B of the shielding line 12 is coupled capacitively to the stray coupling path 13 via a coupling capacitor 14 derived from a parasitic capacitance. More specifically, the coupling capacitor 14 is produced by the end 12B of the shielding line 12 and the wiring patterns 6A and 6B which are separated from each other but situated close to the end 12B.

The transmitting SAW filter 5 and the receiving SAW filter 4 determine passing characteristics of the antenna duplexer 1001 during transmitting and receiving, respectively. In addition, the shielding line 12 having the end 12A connected to the grounding terminal 10A functions as an inductor at high frequencies. The inductor is connected at the end 12B of the shielding line 12 in series to the coupling capacitor 14, thus providing a series resonance circuit 51. The stray coupling path 13 between the transmitting terminal 7 and the receiving terminal 8 is grounded via the series resonance circuit 51, and produces an attenuation pole for isolation between the transmitting terminal 7 and the receiving terminal 8, thereby improving the isolation.

Figure 3:
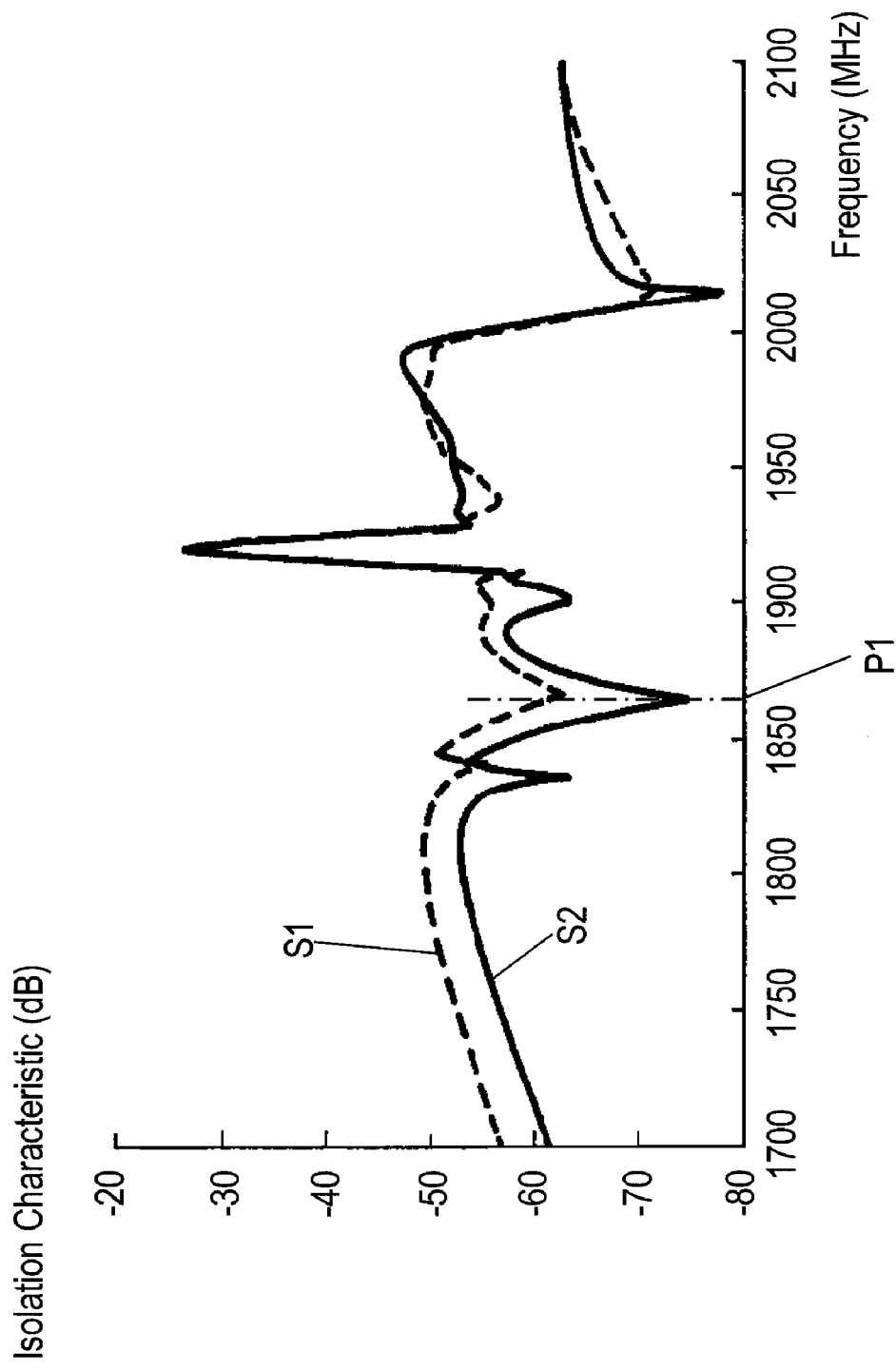
FIG. 3 illustrates isolation characteristics of the antenna duplexer according to the embodiment

FIG. 3 illustrates isolation characteristics between the transmitting terminal 7 and the receiving terminal 8. The vertical axis represents the isolation, and the horizontal axis represents frequencies. While the profile S1 denoted by the broken line represents the isolation characteristic between a receiving terminal and a transmitting terminal of a comparative antenna duplexer which does not include the shielding line 12, the profile S2 denoted by the solid line represents the isolation characteristic between the transmitting terminal 7 and the receiving terminal 8 of the antenna duplexer 1001 according to this embodiment. The profile S2 includes an attenuation pole P1 produced by the series resonance circuit 51 formed by the shielding line 12 and the coupling capacitor 14, and thus, an isolation characteristic better than that of the profile S1.

The transducers 3 mounted on the piezoelectric substrate 2 are coupled to each other by surface acoustic waves, that is, connected to each other by an acoustic coupling. The series resonance circuit 51 formed by the shielding line 12 and the coupling capacitor 14 influences only the high-frequency coupling between the transmitting terminal 7 and the receiving terminal 8, and does not influence the acoustic coupling of the transducers 3 between the transmitting terminal 7 and the antenna terminal 9 or between the antenna terminal 9 and the receiving terminal 8.

The series resonance circuit 51 is produced by a series resonance between an inductance of the shielding line 12 and the coupling capacitor 14 at the end 12B opening. The frequency at the attenuation pole P1 of the series resonance circuit 51 can be controlled by adjusting the width or length of the shielding line 12 as to adjust the distance between the end 12B of the shielding line 12 and the wiring patterns 6A and 6B or to adjust an area with which the end 12B of the shielding line 12 and the wiring patterns 6A and 6B face each other. The frequency is determined to be at a frequency which the antenna duplexer 1001 uses as to improve the isolation characteristic between the SAW filters 4 and 5.

A groove is provided in the surface 2A of the piezoelectric substrate 2 between the regions 104 and 105, i.e., between the SAW filters 4 and 5, to suppress the acoustic coupling. The groove and the shielding line 12 for suppressing the acoustic coupling and the high-frequency coupling, respectively, further improve the isolation characteristic of the antenna duplexer 1001.

INDUSTRIAL APPLICABILITY

An antenna duplexer according to the present invention is capable of improving an isolation characteristic at high-frequencies, accordingly being useful for mobile communication apparatus, such as mobile telephones, which is required to be small and to have high performance.

The invention claimed is:

1. An antenna duplexer comprising:
    a piezoelectric substrate having a surface thereof;
    a grounding terminal to be grounded;
    a first surface acoustic wave (SAW) filter mounted on the surface of the piezoelectric substrate;
    a second SAW filter mounted on the surface of the piezoelectric substrate;
    a first terminal connected to the first SAW filter;
    a second terminal connected to the second SAW filter, the second terminal producing a stray coupling path between the first terminal and the second terminal; and
    a line mounted on the surface of the piezoelectric substrate between the first SAW filter and the second SAW filter, the line having a first end and a second end, the first end of the line being connected to the grounding terminal, the second end of the line being open and being coupled capacitively to the stray coupling path,
    wherein only the first end of the line is connected to the grounding terminal,
    wherein the first SAW filter, the second SAW filter, and the line are separated from each other on the surface of the piezoelectric substrate, and
    wherein the line is not branched.

2. The antenna duplexer according to claim 1, further comprising a package accommodating the piezoelectric substrate.

* * * * *